(12) United States Patent
Yamamoto et al.

(10) Patent No.: US 11,545,603 B2
(45) Date of Patent: Jan. 3, 2023

(54) LIGHT-EMITTING MODULE AND METHOD OF MANUFACTURING THE SAME

(71) Applicant: NICHIA CORPORATION, Anan (JP)

(72) Inventors: Saiki Yamamoto, Tokushima (JP); Shinya Matsuoka, Anan (JP)

(73) Assignee: NICHIA CORPORATION, Anan (JP)

( * ) Notice: Subject to any disclaimer, the term of this patent is extended or adjusted under 35 U.S.C. 154(b) by 201 days.

(21) Appl. No.: 16/843,884

(22) Filed: Apr. 9, 2020

(65) Prior Publication Data

US 2020/0343422 A1 Oct. 29, 2020

(30) Foreign Application Priority Data

Apr. 23, 2019 (JP) .............................. JP2019-082309

(51) Int. Cl.
*H01L 33/58* (2010.01)
*H01L 25/16* (2006.01)
*H01L 33/50* (2010.01)
*H01L 33/48* (2010.01)

(52) U.S. Cl.
CPC ............ *H01L 33/58* (2013.01); *H01L 25/165* (2013.01); *H01L 25/167* (2013.01); *H01L 33/486* (2013.01); *H01L 33/502* (2013.01); *H01L 2933/0058* (2013.01); *H01L 2933/0091* (2013.01)

(58) Field of Classification Search
CPC ..... H01L 25/167; H01L 25/16; H01L 25/165; H01L 25/18; H01L 25/0753; H01L 33/486; H01L 33/58; H01L 33/505; H01L 33/52; H01L 33/54; H01L 33/60
See application file for complete search history.

(56) References Cited

U.S. PATENT DOCUMENTS

| 2006/0170078 | A1 | 8/2006 | Moriya et al. |
| 2013/0077280 | A1 | 3/2013 | Bemmerl et al. |
| 2013/0171440 | A1 | 7/2013 | Arita et al. |
| 2014/0361200 | A1 | 12/2014 | Rudmann et al. |
| 2016/0190402 | A1 | 6/2016 | Kobayashi |
| 2017/0243850 | A1 | 8/2017 | Bemmerl et al. |
| 2017/0288096 | A1* | 10/2017 | Yamanoi .................. H01L 33/60 |
| 2019/0198729 | A1 | 6/2019 | Hayashi |

FOREIGN PATENT DOCUMENTS

| JP | 05-57859 | 3/1993 |
| JP | 2001-156378 | 6/2001 |
| JP | 2006-245536 | 9/2006 |
| JP | 2012-004168 | 1/2012 |

(Continued)

*Primary Examiner* — Sue A Purvis
*Assistant Examiner* — Jordan M Klein
(74) *Attorney, Agent, or Firm* — Mori & Ward, LLP

(57) ABSTRACT

A light-emitting module includes a substrate, at least one light-emitting element disposed on the substrate, at least one electronic component disposed on the substrate, a lens disposed apart from the at least one light-emitting element and the at least one electronic component to face the at least one light-emitting element and the at least one electronic component, and at least one plate-shaped covering member each disposed between the lens and a corresponding one of the at least one electronic component. The at least one covering member contains a coloring agent.

14 Claims, 9 Drawing Sheets

(56) References Cited

FOREIGN PATENT DOCUMENTS

| | | |
|---|---|---|
| JP | 2012-015437 | 1/2012 |
| JP | 2012-087292 | 5/2012 |
| JP | 2012-174979 | 9/2012 |
| JP | 2013-529387 | 7/2013 |
| JP | 2015-508509 | 3/2015 |
| JP | 2015-181181 | 10/2015 |
| JP | 2016-119402 | 6/2016 |
| JP | 2016-127144 | 7/2016 |
| JP | 2018-195487 | 12/2018 |
| JP | 2019-114710 | 7/2019 |
| WO | WO 2013/091829 | 6/2013 |

* cited by examiner

LIGHT-EMITTING MODULE AND METHOD OF MANUFACTURING THE SAME

CROSS-REFERENCE TO RELATED APPLICATION

This application claims priority to Japanese Patent Application No. 2019-082309, filed on Apr. 23, 2019, the entire contents of which are hereby incorporated by reference.

BACKGROUND OF THE INVENTION

The present disclosure relates to a light-emitting module and a method of manufacturing the same.

A known light-emitting module used for a camera flash or the like employs a combination of a light-emitting element and a lens (for example, see WO 2013/091829).

SUMMARY

In a conventional light-emitting module, an electronic component disposed in a region behind a lens can be seen through the lens, which detracts from the appearance. Accordingly, in a light-emitting device, it is desirable that an electronic component is not easily seen through a lens.

Thus, there is a need to provide a light-emitting module that has a good appearance when viewed through a lens and a method of manufacturing the same.

According to one embodiment of the present disclosure, a light-emitting module includes a substrate, at least one light-emitting element disposed on the substrate, at least one electronic component disposed on the substrate, a lens disposed apart from the at least one light-emitting element and the at least one electronic component to face the at least one light-emitting element and the at least one electronic component, and at least one plate-shaped covering member each disposed between the lens and a corresponding one of the at least one electronic component. The at least one covering member contains a coloring agent.

According to one embodiment of the present disclosure, a method of manufacturing a light-emitting module, the light-emitting module including a substrate, at least one light-emitting element on the substrate, at least one electronic component disposed on the substrate, and a lens facing the light-emitting element and the electronic component, includes providing the substrate that is provided with the at least one light-emitting element and the at least one electronic component, disposing at least one plate-shaped covering member to cover an upper surface of a corresponding at least one of the at least one the electronic component, and disposing the lens to face the at least one light-emitting element with a lens frame supporting the lens.

Certain embodiments of the present disclosure allow for obtaining a light-emitting module that has a good appearance and a method of manufacturing the same.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein.

DETAILED DESCRIPTION OF EMBODIMENTS

Figure 1:
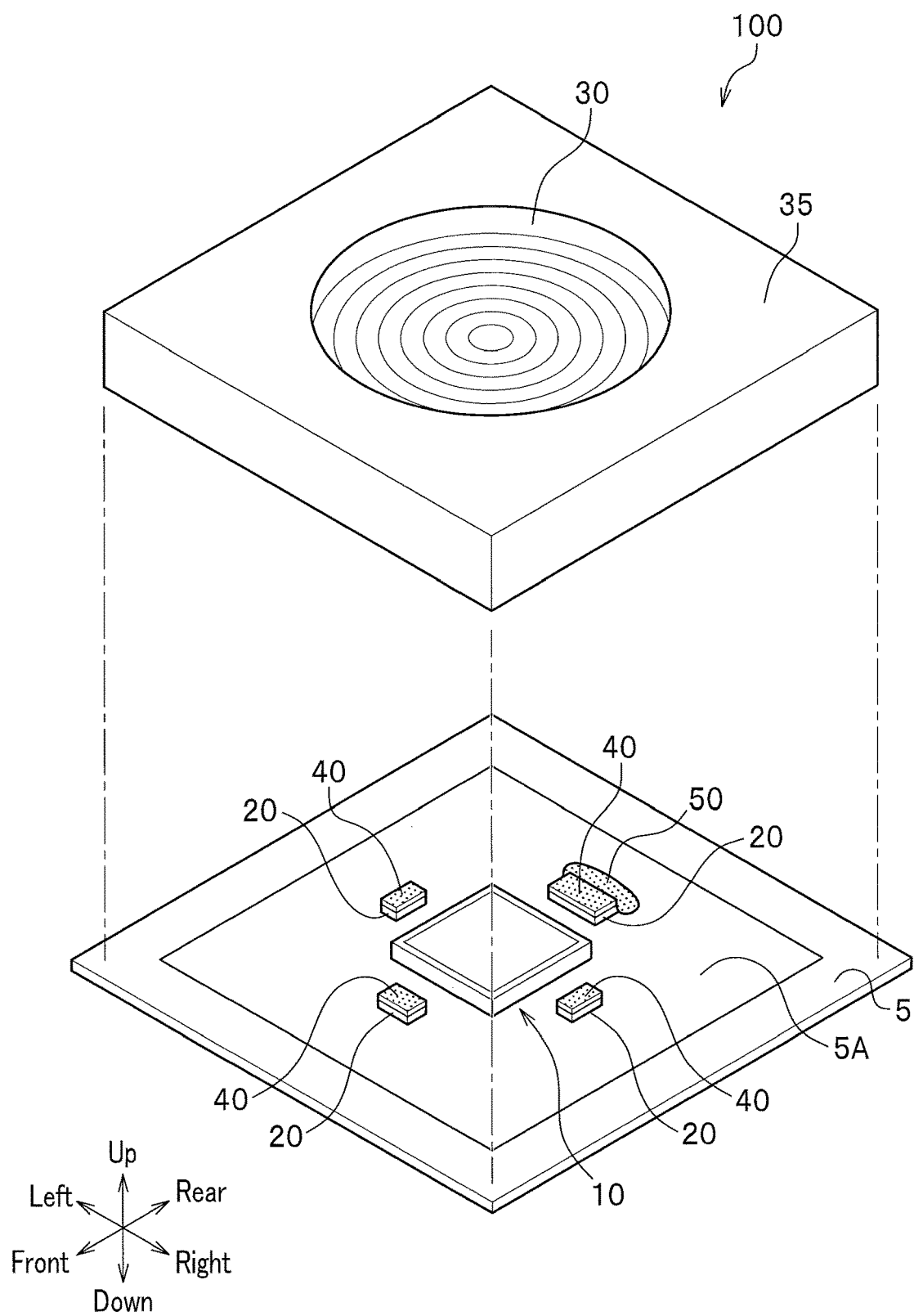
FIG. 1 is a schematic exploded perspective view of the structure of a light-emitting module according to a first embodiment.

Hereinafter, a light-emitting module according to certain embodiments of the present invention is described.

The drawings referred to in the description below schematically illustrate certain embodiments of the present invention, and the scales, the distances, the positional relationships, and the like of members may be exaggerated, or illustration of some members may be omitted. Also, the scale of a member and the distance between members may not be consistent between a plan view and a cross-sectional view. Further, in the description below, the same designations or reference numerals indicate the same members or members made of the same materials, and a detailed description thereof may be omitted as appropriate.

In a light-emitting module according to certain embodiments of the present invention, the terms "upper," "lower,"

"left" and "right" are interchangeable depending on the situation. In the present specification, the terms such as "upper" or "lower" are used to indicate a relative position between components in the drawings referred to for an explanation, and are not intended to indicate an absolute position unless otherwise specified.

First Embodiment

Structure of Light-Emitting Module

Figure 2:
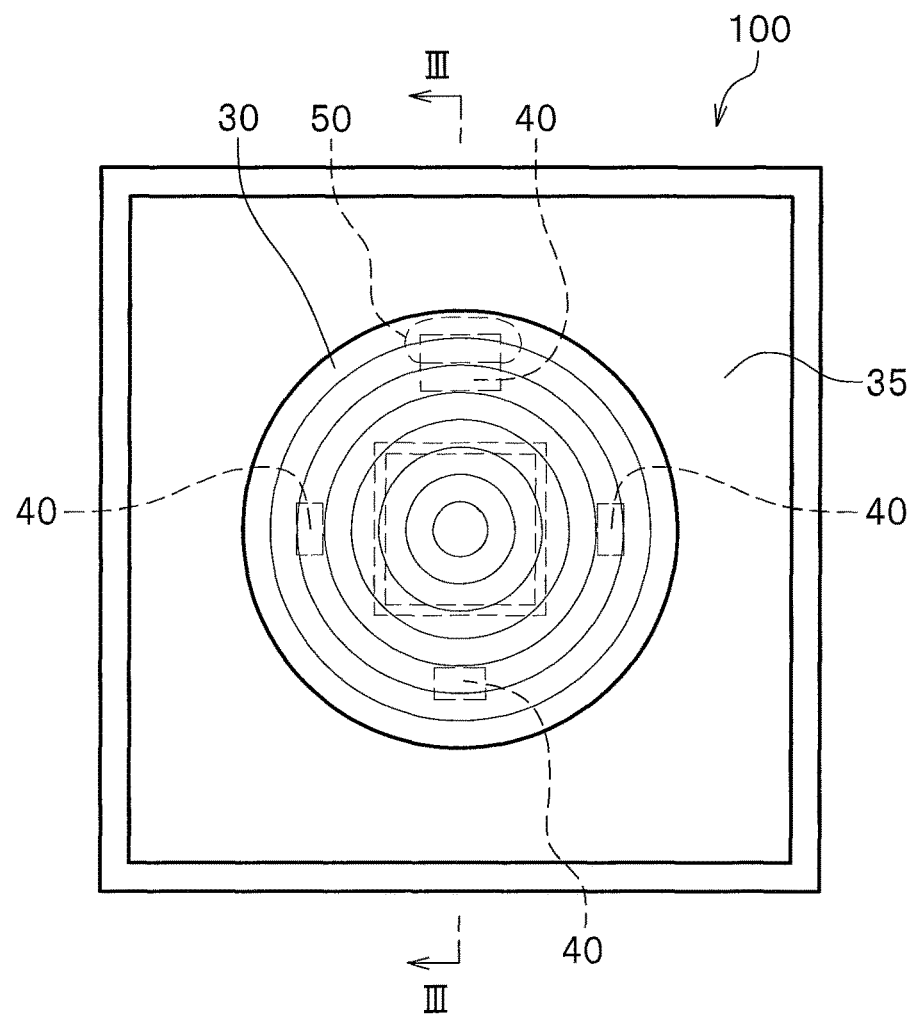
FIG. 2 is a schematic plan view of the light-emitting module according to the first embodiment.
Figure 3:
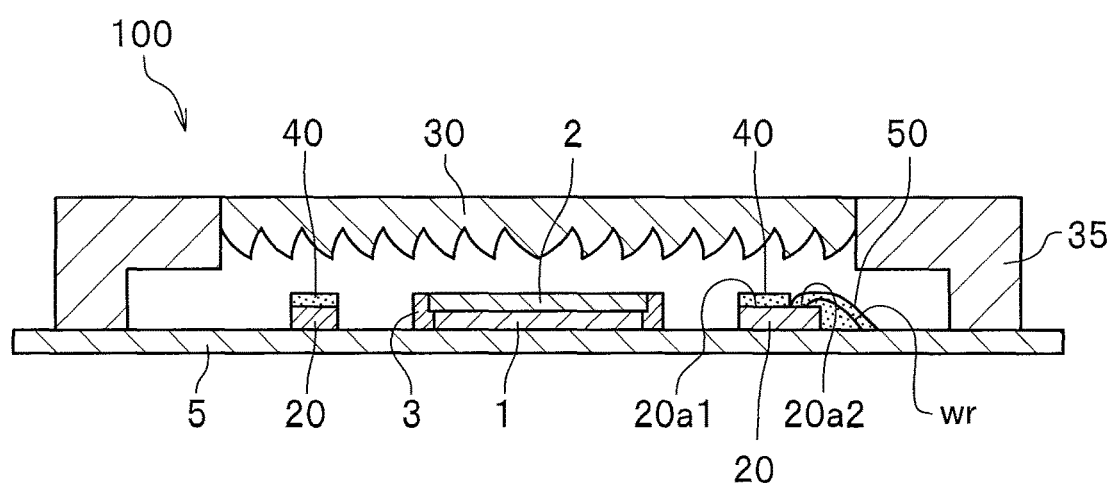
FIG. 3 is a schematic cross-sectional view of the internal structure of the light-emitting module taken along the line III-III of FIG. 2.
Figure 4A:
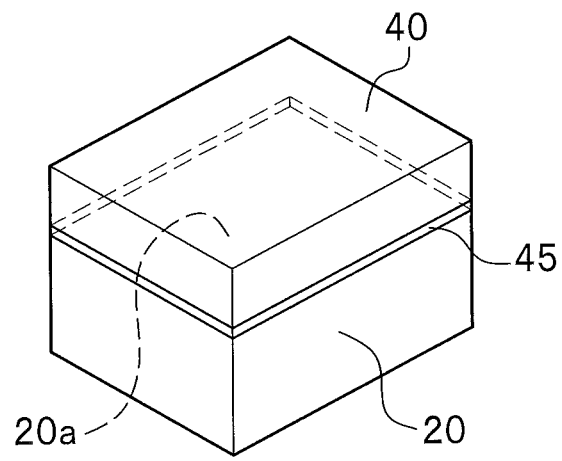
FIG. 4A is a schematic perspective view showing the relationship between a covering member disposed on the upper surface of an electronic component and the electronic component in the light-emitting module according to the first embodiment.

The structure of a light-emitting module according to a first embodiment of the present invention will be described referring to FIG. 1 to FIG. 3 and FIG. 4A. FIG. 1 is a schematic exploded perspective view of the structure of the light-emitting module according to the first embodiment. FIG. 2 is a schematic plan view of the light-emitting module according to the first embodiment. FIG. 3 is a schematic cross-sectional view of the internal structure of the light-emitting module taken along the line III-III of FIG. 2. FIG. 4A is a schematic perspective view for showing the relationship between a covering member disposed on the upper surface of an electronic component and the electronic component in the light-emitting module according to the first embodiment.

For example, a light-emitting module 100 constitutes a flash module for a camera. The light-emitting module 100 is incorporated in a casing of a smartphone, a tablet device, or the like.

The casing includes, for example, a body made of stainless steel and a cover glass covering a lens 30 of the light-emitting module 100 that is incorporated in the casing. The casing may not include the cover glass. In this case, the light-emitting module 100 can have a structure in which the lens 30 is directly exposed from the body instead of being covered with the cover glass.

The light-emitting module 100 includes a substrate 5, at least one light-emitting element 1 disposed on the substrate 5, at least one electronic component 20 disposed on the substrate 5, the lens 30 disposed apart from the light-emitting element 1 and the electronic component 20 to face the light-emitting element 1 and the electronic component 20, and a plate-shaped covering member 40 disposed between the lens 30 and the electronic component 20 and containing a coloring agent. The at least one light-emitting element 1 is disposed in the light-emitting module 100 such that the at least one light-emitting element 1 is included in a light-emitting device 10 that is disposed on the substrate 5. The structure of the light-emitting module 100 will be described below.

The substrate 5 includes a base and conductor wiring on an upper surface of the base. The substrate 5 supports components such as the light-emitting element 1 and the electronic component 20. A package substrate generally used for a light-emitting device can be used for the substrate 5. For example, a ceramic substrate including AlN, a metal substrate including Al, and a resin substrate including glass epoxy can be used. The conductor wiring is patterned into a predetermined shape on the base and is configured to supply electric power to the light-emitting element 1 and the electronic component 20 from an external device. The conductor wiring is connected to an external power supply through a wiring portion extending through the substrate 5 and a wiring portion exposed on the lower surface of the substrate 5. A metal material can be used for the conductor wiring. For example, single-element metals such as Ag, Al, Ni, Rh, Au, Cu, Ti, Pt, Pd, Mo, Cr, or W or alloys containing these metals can be preferably used for the conductor wiring. Single-element metals such as Ag, Al, Pt, or Rh, which have high reflectivity, or alloys containing these metals are more preferable.

A resist layer 5A having a color similar to a light-transmissive member 2 containing a phosphor is preferably disposed on a surface of the substrate 5. The resist layer 5A disposed on a surface of the substrate 5 can be white. The resist layer 5A disposed on a surface of the substrate 5 protects the conductor wiring. The resist layer 5A can contain a reflective material to increase the light extraction efficiency of the light-emitting module 100.

The light-emitting device 10 includes at least one light-emitting element 1, the light-transmissive member 2 disposed on the light extraction surface of the light-emitting element 1, and a protective member 3 covering lateral surfaces of the light-emitting element 1 and lateral surfaces of the light-transmissive member 2. The light-emitting device 10 is disposed on the substrate 5 to be electrically connected to the wiring on the lower surface of the substrate 5 by via holes or the like formed in the substrate 5. The light-emitting device 10 is disposed on the substrate 5 at a position overlapping with the lens 30, such as a position overlapping with the center of the lens 30, in a plan view. The light-emitting device 10 in this example is configured to emit white light.

For example, the light-emitting element 1 includes a semiconductor layer on a light-transmissive substrate made of sapphire. The semiconductor layer includes an n-side semiconductor layer, an active region, and a p-side semiconductor layer in the order from the substrate side. For the light-emitting element 1 to emit ultraviolet light or blue-to-green visible light, for example, GaN or InGaN nitride semiconductors represented as $In_XAl_YGa_{1-X-Y}N$ (where $0 \leq X \leq 1$, $0 \leq Y \leq 1$, and $X+Y \leq 1$) can be used. In a plan view, the light-emitting element 1 has, for example, a rectangular shape, a circular shape, an elliptic shape, a triangular shape, or a polygonal shape such as a hexagonal shape.

The light-emitting element 1 preferably includes positive and negative electrodes on the same surface side of the light-emitting element 1. This structure allows the light-emitting element 1 to be flip-chip mounted on the substrate 5. The positive and negative electrodes of the light-emitting element 1 are electrically connected to respective ones of the conductor wirings of the substrate 5 by bonding members such as bumps, electrically-conductive paste, or solder.

The light-transmissive member 2 is a plate-shaped member having a substantially rectangular shape in a plan view and covers the upper surface of the light-emitting element 1. The light-transmissive member 2 can be made of a light-transmissive resin material or an inorganic substance such as a ceramic or glass. Examples of the resin material include a thermosetting resin such as a silicone resin, a silicone modified resin, an epoxy resin, or a phenolic resin. Alternatively, a thermoplastic resin such as a polycarbonate resin, an acrylic resin, a methylpentene resin, or a polynorbornene resin can be used. A silicone resin or a silicone modified resin, which have good light and heat resistance, is particularly preferable. The expression "light-transmissive" as used herein refers to a property of transmitting 60% or more of light emitted from the light-emitting element 1. In addition, the light-transmissive member 2 can contain a light-diffusing material or a phosphor that performs wavelength conversion of at least a portion of light emitted from the light-emitting element 1. Examples of the light-transmissive member 2 containing the phosphor include a sintered body of a phosphor, and a mixture of a phosphor and a resin material described above, a ceramic, or glass.

For example, when a blue light-emitting element is used for the light-emitting element 1 and the light-transmissive member 2 contains a yellow phosphor, a light-emitting device 10 configured to emit white light is obtained.

Examples of the phosphor contained in the light-transmissive member 2 include yellow phosphors such as YAG phosphors represented as $Y_3Al_5O_{12}$:Ce and silicates, or red phosphors such as CASN phosphors represented as $CaAlSiN_3$:Eu and KSF phosphors represented as $K_2SiF_6$:Mn.

Examples of the light-diffusing material contained in the light-transmissive member 2 include titanium oxide, barium titanate, aluminum oxide, and silicon oxide.

The protective member 3 directly or indirectly covers the lateral surfaces of the light-emitting element 1 and the lateral surfaces of the light-transmissive member 2 to protect the lateral surfaces of the light-emitting element 1 and the lateral surfaces of the light-transmissive member 2. An upper surface of the light-transmissive member 2 is exposed from the protective member 3 and serves as the light-emitting surface (that is, the main light extraction surface) of the light-emitting device 10. The protective member 3 is preferably made of a member having a high light reflectance. For example, a resin material containing a light-reflective substance can be used for the protective member 3. Examples of the light-reflective substance include titanium oxide, silicon oxide, zirconium oxide, potassium titanate, aluminum oxide, aluminum nitride, boron nitride, zinc oxide, and mullite. A resin material whose main component is a thermosetting resin such as an epoxy resin, a silicone resin, a silicone modified resin, or a phenolic resin is preferably used for a base material of the protective member 3. The protective member 3 can be made of a member that transmits visible light as needed.

The electronic component 20 is electrically connected to the substrate. Examples of the electronic component 20 include an optical sensor, a Zener diode, a thermistor, and a capacitor. The electronic component 20 has, for example, a rectangular parallelepiped shape or a cylindrical shape. The electronic component 20 is disposed on the substrate 5 to be apart from the lens 30, and may or may not face the lens 30.

For example, an optical sensor is disposed to face the lens 30 and is used in the case where the drive current of the light-emitting device 10 is controlled according to the intensity of light received through the lens 30. Large portions of the electronic components 20 are generally covered with a black resin or are made of black members. Depending on the arrangement of electrodes or the like, an upper surface 20a of the electronic component 20 such as an optical sensor can include a first portion 20a1 serving as a flat portion that receives light and a second portion 20a2 serving as connecting portion (or a functional portion) to wires wr or the like.

As shown in FIG. 3 and FIG. 4A, the covering member 40 is disposed between the lens 30 and the electronic component 20 facing the lens 30 so that the electronic component 20 does not look black in appearance through the lens 30. The covering member 40 is a plate-shaped member containing a coloring agent. The covering member 40 covers, for example, at least a portion or an entirety of the upper surface 20a of the electronic component 20. The covering member 40 can be bonded onto the electronic component 20 via, for example, a resin adhesive 45. The covering member 40 is preferably apart from the lower surface of the lens 30. The covering member 40 is made of, for example, a resin or glass, and has a plate shape. The covering member 40 contains a coloring agent so as to have a color similar to a color of the light-transmissive member 2 containing a phosphor or a light-diffusing material and/or the resist layer disposed on the substrate. Alternatively, the covering member 40 contains a coloring agent so as to be white. In the case where, for example, the covering member 40 covers the entirety of the upper surface 20a of the electronic component 20, the covering member 40 has a size substantially equal to or larger than a size of the upper surface 20a. The expression "substantially equal to the upper surface 20a of the electronic component 20" as used herein indicates that a difference from a side of the upper surface 20a in the range of ±30 μm.

In the present embodiment, each of the covering members 40 is disposed on the upper surface 20a of a respective one of four electronic components 20 via a respective resin adhesive 45, and the four covering members 40 have a plate shape with substantially the same thickness. The covering members 40 has a thickness equal to or smaller than a thickness that allows the upper surface of the covering member 40 on the electronic component 20 to be in contact with the lower surface of the lens 30. The thickness of the covering member 40 is more preferably adjusted such that the height of the upper surface of the covering member 40 disposed on the electronic component 20 is lower than 200 μm above the upper surface of the light-transmissive member 2. The covering member 40 has a thickness that allows for preventing the black electronic component 20 from being seen through the covering member 40 containing a coloring agent. The four covering members 40 can have different thicknesses according to the types, shapes, and heights of the electronic components 20. While the covering members 40 have a rectangular shape in a plan view in the present embodiment, the covering members 40 can have, for example, an oblong circular shape, an elliptic shape, a trapezoidal shape, a parallelogrammic shape, or a triangular shape in a plan view as long as the electronic components 20 can be covered. The covering members 40 may not have a flat plate shape, and can have other shapes including plate-shaped portions as shown in FIG. 4E and FIG. 4F as described below. Alternatively, each plate-shaped covering member 40 can be processed to cover a portion of at least one of the lateral surfaces of the electronic component 20 as shown in FIG. 4G and FIG. 4H.

Examples of the base material of the covering member 40 include resin materials such as a silicone resin, an epoxy resin, or a polycarbonate resin, glass, and ceramics. The covering member 40 contains a coloring agent. At least one of a phosphor, a pigment, and a dye is contained as the coloring agent. For example, the phosphor can be the same as the phosphor contained in the light-transmissive member 2. An inorganic or organic material can be used for the pigment. Examples of the inorganic materials include colcothar ($Fe_2O_3$), minium ($Pb_3O_4$), titanium oxide ($TiO_2$), chromium oxide ($Cr_2O_3$), titanium nickel antimony oxides, titanium nickel barium oxides, titanium chromium antimony oxides, and titanium chromium niobium oxides. Examples of the organic materials include anthraquinone compounds, azo compounds, quinacridone compounds, perylene compounds, diketopyrrolopyrrole compounds, monoazo compounds, disazo compounds, pyrazolone compounds, benzimidazolone compounds, quinoxaline compounds, azomethine compounds, and isoindolinone compounds. Examples of the dye include anthraquinone dyes, methine dyes, azomethine dyes, oxazine dyes, azo dyes, styryl dyes, coumarin dyes, porphyrin dyes, dibenzofuranone dyes, diketopyrrolopyrrole dyes, rhodamine dyes, xanthene dyes, and pyrromethene dyes. It is generally preferable that the pigment and the dye do not convert the wavelengths of light emitted from the light-emitting element 1.

The covering member 40 contains the coloring agent in the base material, and is formed into a plate shape. The covering member 40 is preferably white or has a color similar to the light-transmissive member 2 due to the coloring agent.

The "color similar to" herein refers to a color within a range of a 15-step MacAdam ellipse.

In an example in which the covering member 40 is disposed between the electronic component 20 and the lens 30, the covering member 40 is bonded to the upper surface 20a of the electronic component 20 via the resin adhesive 45. A material such as an epoxy resin or a silicone resin is used for the resin adhesive 45. The covering member 40 can be bonded to the upper surface 20a of the electronic component 20 with double-sided tape. Also, the covering member 40 made of an adhesive resin can be bonded to the upper surface 20a of the electronic component 20. When the covering member 40 and the electronic component 20 are made of a ceramic or glass, the covering member 40 can be bonded to the upper surface 20a of the electronic component 20 using inorganic bonding. The covering member 40 can be bonded to the upper surface 20a of the electronic component 20 using thermocompression bonding (welding).

When the electronic component 20 is connected to the substrate by connecting members such as the wires wr as shown in FIG. 1 and FIG. 3, the covering member 40 covers the flat first portion 20a1, to which the wires wr are not connected, of the upper surface 20a of the electronic component 20. The second portion 20a2, exposed from the covering member 40, of the upper surface 20a is covered with a covering resin 50. That is, the combination of the covering member 40 and the uncured covering resin 50 disposed on the second portion 20a2, to which the wires wr are connected, of the upper surface 20a of the electronic component 20 covers the entire upper surface 20a of the electronic component 20. An uncured resin material is supplied by application through a nozzle or the like, so that the covering resin 50 is disposed on the second portion 20a2 of the upper surface 20a of the electronic component 20 to cover the wires wr. For the covering resin 50, a resin material, such as a silicone resin, an epoxy resin, or a polycarbonate resin, containing a coloring agent substantially the same as that in the covering member 40 can be used. The covering resin 50 is preferably supplied in an uncured fluid state so that the wires wr are not deformed.

As described above, the covering member 40 contains the coloring agent and covers at least a portion of the electronic component 20 facing the lens 30 so that the electronic component 20 is not easily seen through the lens 30. With the plate-shaped covering members 40 disposed between the electronic components 20 and the lens 30, the covering members 40 covering the electronic components 20 have the substantially uniform thickness without variations in thickness. This structure allows for reducing variations in the operation of the electronic component such as an optical sensor that receives light transmitted through the covering member 40. In the case where the upper surface of the electronic component 20 has a connecting portion to the wires wr or the like or irregularities, it may be difficult to directly apply the covering member 40 to the electronic component 20. In this case, the covering member 40 can cover the electronic component 20 such that the covering member 40 serves also as the covering resin 50, or a covering member (for example, see FIG. 4F) having formed into a predetermined shape can be used as described below, according to the state of the upper surface of the electronic component 20.

The lens 30 is disposed above the light-emitting device 10 with a lens frame 35, as shown in FIG. 1 to FIG. 3. The lens frame 35 is apart from the light-emitting device 10 and attached to the substrate 5 using an adhesive member such as resin. The lens frame 35 is disposed such that the lens 30 covers the entirety of a light emission surface of the light-emitting element 1 in a plan view, as shown in FIG. 1. In a plan view, the lens 30 has an outer shape of, for example, a rectangular shape, a circular shape, or an elliptic shape. The lens 30 can be manufactured using a material known in the art by a known manufacturing method. Examples of a material of the lens 30 include resins and glass. These materials can contain a light-diffusing material or the like.

For the lens 30 in this example, a Fresnel lens is used. The Fresnel lens has a surface having irregularities and a flat surface opposite to the surface having irregularities, and is disposed such that the surface having irregularities faces the light-emitting device 10 side so as to allow light emitted from the light-emitting device 10 to be incident on the surface having irregularities and to be emitted from the flat surface. Using a Fresnel lens for the lens 30 allows for reducing a thickness of the lens 30. Accordingly, the light extraction length from the light-emitting element, serving as the light source of the light-emitting module, can be reduced. Also, reduction in thickness of the lens 30 allows for facilitating formation of an air layer between the lens 30 and the light-emitting device 10. With the air layer, spread of light emitted from the light-emitting device 10 can be adjusted.

Operation of Light-Emitting Module

In the light-emitting module 100 having the structure described above, when the switch is turned on, an electric current is supplied to the light-emitting element 1 through a corresponding wiring, so that the light-emitting element 1 emits light. Light emitted from the light-emitting element 1 is extracted to the outside from the upper surface of the light-emitting element 1 through the lens 30. When the light-emitting module 100 including an optical sensor for an electronic component 20 is used for a camera flash module, the light-emitting module 100 can automatically produce a flash of light according to the brightness of the environment of the subject. In the light-emitting module 100, the covering members 40 are disposed between the electronic components 20 and the lens 30, which allows the electronic component 20 to be not easily seen through the lens, and the light-emitting module 100 has a good appearance through the lens. Further, the covering members 40 have a plate shape, which allows reduction of variation in the thicknesses of the covering members 40, so that the operation of an electronic component such as an optical sensor that operates according to light from the outside can be uniformly controlled.

Method of Manufacturing Light-Emitting Module

Figure 5:
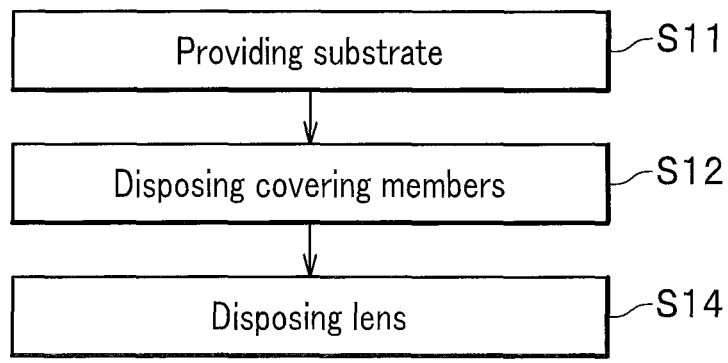
FIG. 5 is a flowchart of a method of manufacturing the light-emitting module according to the first embodiment.

Next, a method of manufacturing the light-emitting module is described referring to FIG. 5. As shown in FIG. 5, the method of manufacturing the light-emitting module includes Step S11 of providing substrate, in which the substrate 5 provided with the light-emitting element 1 and at least one electronic component 20 is provided, Step S12 of disposing covering members, in which the plate-shaped covering member 40 is disposed to cover the upper surfaces 20a of the electronic components 20, and Step S14 of disposing a lens, in which the lens 30 is disposed to face the light-emitting element 1 with the lens frame 35 supporting the lens 30.

In Step S11 of providing substrate, the substrate 5 is provided on which the light-emitting element 1 and the electronic components 20 are disposed. In Step S11 of providing substrate, the substrate 5 is provided, on which the light-emitting element 1 is disposed in a disposition region of the substrate 5 and the electronic components 20 such as an optical sensor or a Zener diode are disposed. The light-emitting element 1 in a state of an unpackaged chip can be disposed on the substrate 5, or the light-emitting device 10 in which the light-emitting element 1 is packaged can be disposed on the substrate 5. The light-emitting device 10 includes the light-transmissive member 2 on the light extraction surface of the light-emitting element 1, the light-transmissive member 2 containing a phosphor, and the protective member 3 on the lateral surfaces of the light-emitting element 1 and the lateral surfaces of the light-transmissive member 2. In the light-emitting device 10, the upper surface of the light-transmissive member 2 is exposed from the protective member 3.

In Step S12 of disposing covering members, the plate-shaped covering members 40 are disposed between the lens 30 and respective ones of the electronic components 20 disposed on the substrate 5. In Step S12 of disposing covering members, each of the plate-shaped covering members 40 is disposed to cover the upper surface 20a of a respective one of the electronic components 20. In Step S12 of disposing covering members, each of the covering members 40 having formed into a plate shape is disposed to cover at least a portion of the upper surface 20a of a respective one of the electronic components 20. For example, in the case where the electronic component 20 is a thermistor or a Zener diode, the electronic component 20 generally has a structure having a rectangular parallelepiped shape with an upper surface that is entirely flat and a lower surface provided with a connection terminal to be electrically connected to the substrate. Accordingly, in one example, the plate-shaped covering member 40 is disposed to cover the entirety of the upper surface 20a of the electronic component 20 via the resin adhesive 45. The covering member 40 contains the coloring agent so as to have, for example, a color similar to a color of the appearance of the light-transmissive member 2 constituting the light-emitting surface of the light-emitting device 10 when the covering member 40 is disposed on the electronic component 20. The covering member 40 can have a color, such as white, similar to a color of the protective member 3 of the light-emitting device 10.

In other words, each of the covering members 40 covers a respective one of the electronic components 20 such that the shape and color (mainly black) of the appearance of the electronic components 20 is unlikely to be seen through the lens 30 when the light-emitting module 100 is seen from outside. Accordingly, the material of the coloring agent contained in the covering member 40 is selected such that the electronic component 20 is not easily seen through the lens 30. The electronic component 20 on the substrate 5 can have a structure in which the upper surface 20a has the flat first portion 20a1 and the second portion 20a2 that is not flat or that has a connecting portion connected to the wires wr or the like. In this case, in Step S12 of disposing covering members, the flat first portion 20a1 of the upper surface 20a of the electronic component 20 is covered with the flat plate-shaped covering member 40, and the second portion 20a2 of the upper surface 20a exposed from the covering member 40 is covered with the covering resin 50. Each of the electronic components 20 can have a structure in which only the first portion 20a1 of the upper surface 20a faces the lens 30 (in other words, only the first portion 20a1 of the upper surface 20a is located directly below the lens in a plan view) while the entirety of the upper surface 20a is flat. In this case, the plate-shaped covering member 40 can cover the first portion 20a1 of the upper surface 20a without covering the second portion 20a2, but the covering member 40 preferably covers the entire upper surface in consideration of the appearance in a slant direction. In Step S12 of disposing covering members, the covering member 40 is disposed on the upper surface 20a of the electronic component 20 with the resin adhesive or by welding. The covering member 40 can be disposed on the upper surface 20a of the electronic component 20 with double-sided tape or using another method. Disposing the covering member 40 on a portion or the entirety of the upper surface 20a of the electronic component 20 facing the lens 30 in Step S12 of disposing covering members allows for concealing the color (mainly black) of the appearance of the electronic component 20 that can otherwise be seen through the lens 30, so that the appearance of the light-emitting module 100 can be improved.

In Step S14 of disposing a lens, the lens 30 is secured on the substrate 5 on which the light-emitting device 10 has been disposed. In Step S14 of disposing a lens, the lens 30 is disposed to face the light-emitting element 1 with the lens frame 35 supporting the lens 30.

In one example, the lens 30 is a substantially circular Fresnel lens and is disposed above the light-emitting device 10. At this time, the lens frame 35 is secured onto the substrate 5 such that the upper surface of the light-emitting device 10 is apart from the lens 30. The lens frame 35 includes a rectangular holder portion holding the lens at the central region of the holder and lateral wall portions extending toward the substrate 5 from the four sides of the holder portion at an angle of 90° with respect to the holder portion. End surfaces of the lateral wall portions are bonded to the substrate 5 with an adhesive, so that the lens frame 35 is secured on the substrate 5. The light-emitting module 100 can be manufactured through the steps described above.

When the resist layer 5A is formed on the surface of the substrate 5, the resist layer 5A is disposed using a mask or the like in the area other than areas in which the light-emitting device 10 and the electronic components 20 are placed. The resist layer 5A can be made of a known material and can be disposed using a known method. The resist layer 5A can be disposed in Step S11 of providing substrate, or a substrate 5 on which the resist layer has been disposed can be provided in Step S11 of providing substrate.

For example, the covering members 40 in description of the light-emitting module 100 and the method of manufacturing the light-emitting module can have structures as shown in FIG. 4B to FIG. 4H.

First to seventh modifications of the covering members will be described below.

Figure 4B:
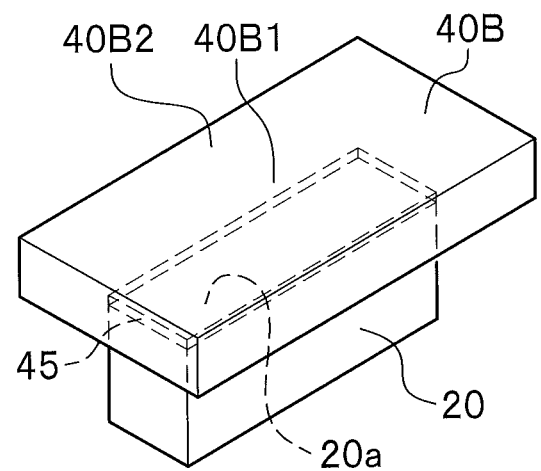
FIG. 4B is a schematic perspective view of a first modification of the covering member covering the upper surface of the electronic component in the light-emitting module.

As shown in FIG. 4B, a covering member 40B of the first modification is disposed on the upper surface 20a of the electronic component 20 via, for example, the resin adhesive 45.

The covering member 40B includes a central covering portion 40B1 facing the upper surface 20a of the electronic component 20 and an extending covering portion 40B2 extending on the periphery (in four directions) of the central covering portion 40B1. The covering member 40B has an area greater than the upper surface 20a of the electronic component 20, and therefore more effectively conceals the electronic component 20 so that the electronic component 20 cannot be seen through the lens 30.

Figure 4C:
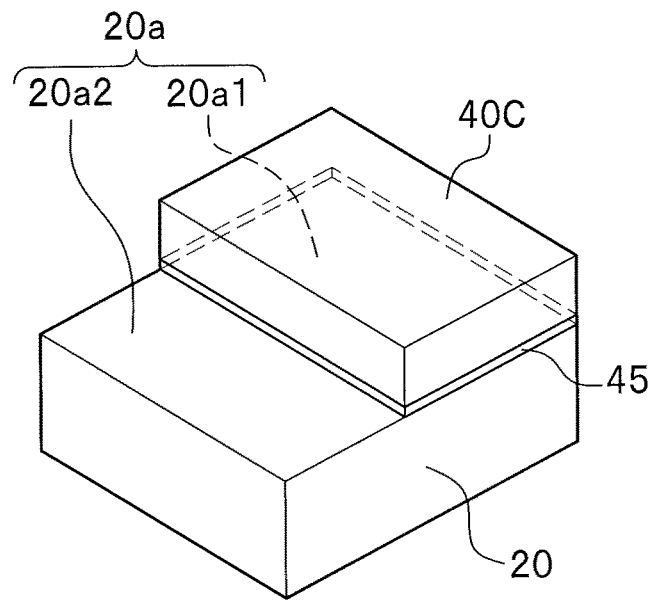
FIG. 4C is a schematic perspective view of a second modification of the covering member covering the upper surface of the electronic component in the light-emitting module.

As shown in FIG. 4C, a covering member 40C of the second modification covers the first portion 20a1 of the upper surface 20a of the electronic component 20 via the resin adhesive 45. The covering member 40C is used in the case in the case in which the first portion 20a1 of the upper surface 20a of the electronic component 20 faces the lens 30 while the second portion 20a2 of the upper surface 20a does not face the lens 30.

Figure 4D:
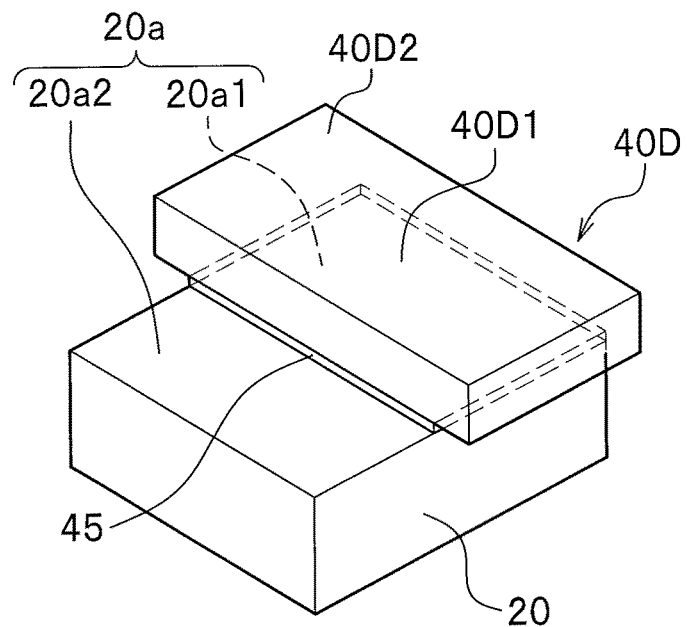
FIG. 4D is a schematic perspective view of a third modification of the covering member covering the upper surface of the electronic component in the light-emitting module.
Figure 4E:
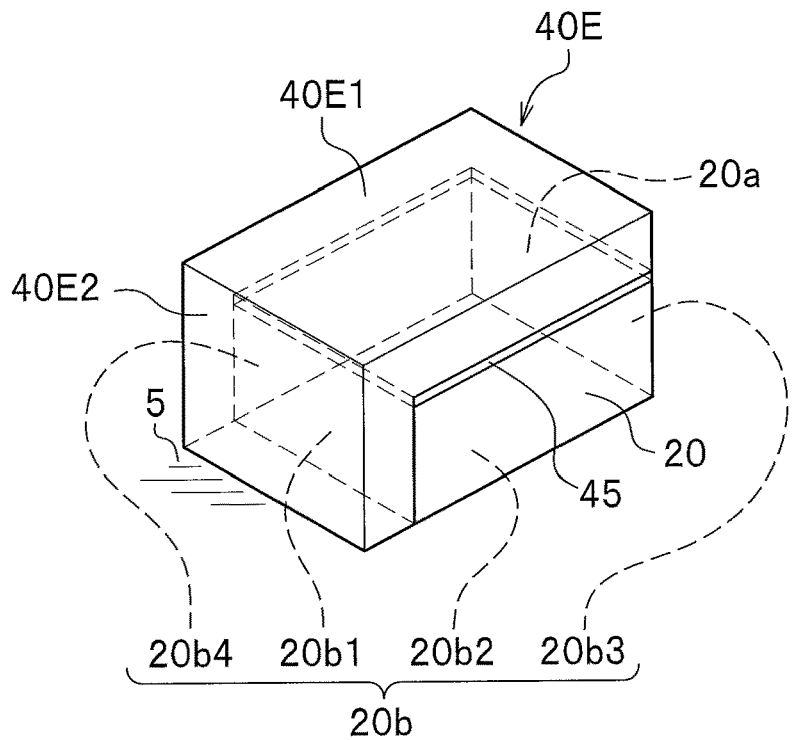
FIG. 4E is a schematic perspective view of a fourth modification of the covering member covering the upper surface of the electronic component in the light-emitting module.
Figure 4F:
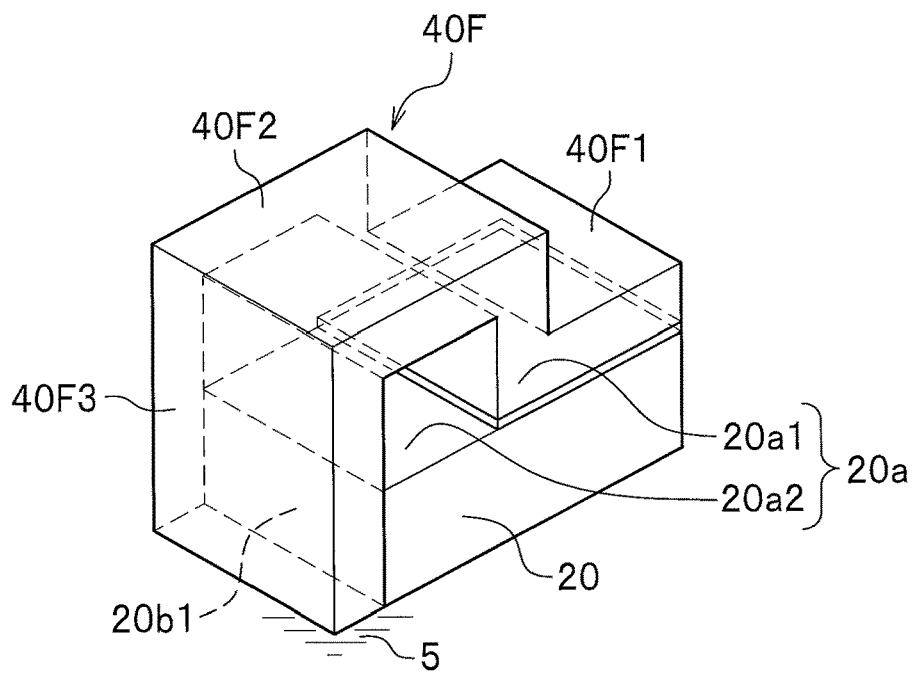
FIG. 4F is a schematic perspective view of a fifth modification of the covering member covering the upper surface of the electronic component in the light-emitting module.
Figure 4G:
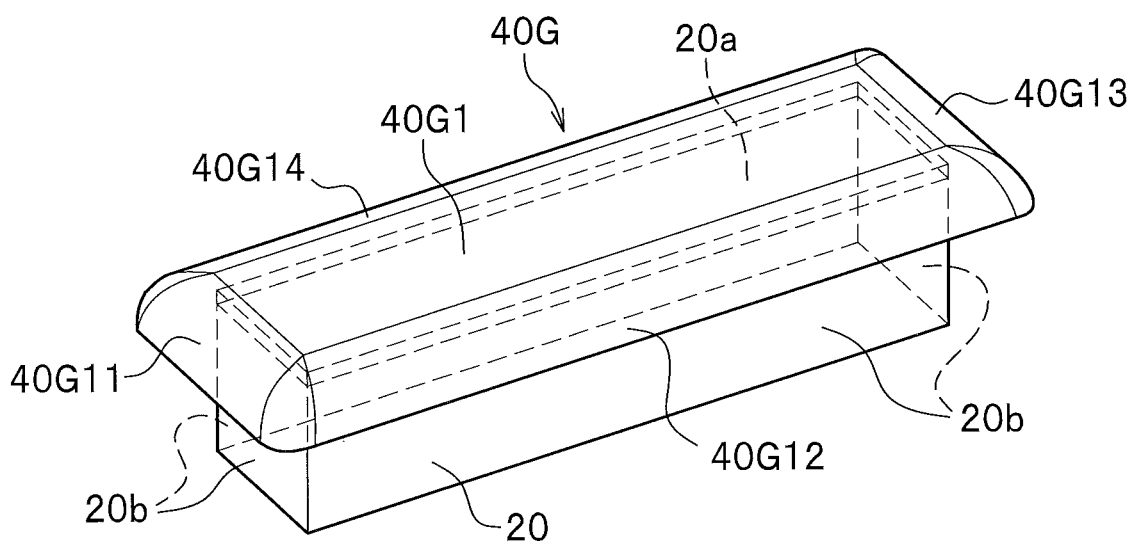
FIG. 4G is a schematic perspective view of a sixth modification of the covering member covering the upper surface of the electronic component in the light-emitting module.
Figure 4H:
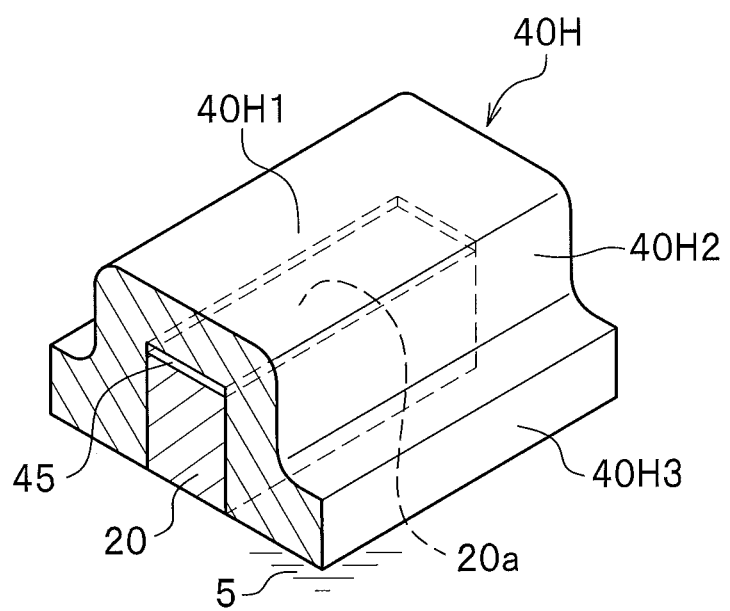
FIG. 4H illustrates a seventh modification of the covering member covering the upper surface of the electronic component in the light-emitting module, and is a schematic, perspective, cross-sectional view of the electronic component and the covering member.

Similarly to FIG. 4C, FIG. 4D shows a covering member 40D of the third modification used to cover the first portion 20a1 of the upper surface 20a of the electronic component 20 via the resin adhesive 45.

The covering member 40D includes a central covering portion 40D1 facing the first portion 20a1 of the upper surface 20a of the electronic component 20 and an extending covering portion 40D2 extending in three directions along a periphery of the central covering portion 40D1. With the covering member 40D including the extending covering portion 40D2, the electronic component 20 can be more effectively concealed so as not to be seen even when the light-emitting surface of the module is seen in a slant direction.

As shown in FIG. 4E, a covering member 40E of the fourth modification includes a central covering portion 40E1 covering the upper surface 20a of the electronic component 20 and a lateral-surface covering portion 40E2 covering a single lateral surface 20b1 among lateral surfaces 20b of the electronic component 20. The lateral surface covering portion 40E2 of the covering member 40E extends from an end of the central covering portion 40E1 that has a rectangular shape in a plan view, along the single lateral surface 20b1 of the electronic component 20 to cover the single lateral surface 20b1. In an example of the covering member 40E, the central covering portion 40E1 is bonded to the upper surface 20a of the electronic component 20 via the resin adhesive 45. With the covering member 40E covering and concealing the upper surface 20a and the lateral surface 20b1 of the electronic component 20, the black color of the electronic component 20 can be prevented from being seen through the lens 30. The structure of the covering member 40E can be such that the lateral surface covering portion 40E2 is connected to the lateral surface 20b1 of the electronic component 20 by the resin adhesive 45 or such that an end surface of the lateral surface covering portion 40E2 and the substrate 5 facing each other are bonded together with the resin adhesive 45.

As shown in FIG. 4F, a covering member 40F of the fifth modification has a bent plate shape. More specifically, the covering member 40F includes a first covering portion 40F1, a second covering portion 40F2 continuous with the first covering portion 40F1, and a third covering portion 40F3 continuous with the second covering portion 40F2. The first covering portion 40F1 faces the first portion 20a1 of the upper surface 20a of the electronic component 20 to cover the first portion 20a1 of the upper surface 20a directly or via the adhesive member 45. The second covering portion 40F2 faces and covers the second portion 20a2 of the upper surface 20a of the electronic component 20 to be spaced apart from the second portion 20a2. The third covering portion 40F3 faces and covers the lateral surface 20b1 among the lateral surfaces 20b of the electronic component 20. The second covering portion 40F2 is located above the first covering portion 4F1 (in other words, closer to the lens 30 than the first covering portion 40F1) so that the second covering portion 40F2 covers a portion connected to the wires wr when, for example, connecting members such as the wires wr are disposed on the second portion 20a2 of the upper surface 20a of the electronic component 20. The third covering portion 40F3 of the covering member 4F extends from an end of the second covering portion 40F2 toward the substrate 5 and faces the lateral surface 20b1 among the lateral surfaces 20b of the electronic component 20.

The lateral surface covering portion 40F3 of the covering member 40F can be in contact with the lateral surface 20b1 of the electronic component 20 or can face the lateral surface 20b1 to be spaced apart from the lateral surface 20b1 at a predetermined distance. The structure of the covering member 4F can have a structure in which the lateral surface covering portion 40F3 is connected to the lateral surface 20b of the electronic component 20 by the resin adhesive 45, or a structure in which an end surface of the lateral-surface covering portion 40F3 and the substrate 5 facing each other are bonded together with the resin adhesive 45.

The portion of the covering member 40E or 40F to be connected using the resin adhesive 45 or the like can be at the substrate 5 or the lateral surface 20b of the electronic component 20. The covering member 40E or 40F may not be in contact with the upper surface 20a of the electronic component 20 as long as the covering member 40E or 40F is located between the lens 30 and the upper surface 20a of the electronic component 20.

As shown in FIG. 4G, a covering member 40G of the sixth modification includes a central covering portion 40G1 covering the upper surface 20a of the electronic component 20 having a substantially rectangular parallelepiped shape, and includes first to fourth lateral surface covering portions 40G11 to 40G14 that are continuous with the central covering portion 40G1. The first to fourth lateral surface covering portions 40G11 to 40G14 cover substantially half the height of the four lateral surfaces 20b connected with the upper surface 20a. A plate-shaped covering member 40G on which the first to fourth lateral surface covering portions 40G11 to 40G14 have been formed to partially cover the lateral surfaces of the electronic component 20 can be bonded to the upper surface 20a of the electronic component 20 via the resin adhesive 45. The covering member 40G can be formed by bonding a member having an extending portion as shown in FIG. 4B to the electronic component 20 via the resin adhesive 45 and then performing Step S13 of processing the covering member (see FIG. 6), in which the extending portion is processed (for example, heated) to be disposed along the lateral surfaces 20b of the electronic component 20.

As shown in FIG. 4H, a covering member 40H of the seventh modification includes a central covering portion 40H1 facing the upper surface 20a of the electronic component 20, lateral surface covering portions 40H2 continuous with the central covering portion 40H1 and covering two lateral surfaces 20b connected with the upper surface 20a of the electronic component 20 and opposite to each other in a single direction, and flange portions 40H3 that are continuous with the lateral surface covering portions 40H2 and are in contact with the substrate 5. The covering member 40H can be a member having a plate shape and including the central covering portion 40H1, the lateral surface covering portions 40H2, and the flange portions 40H3 that are molded together. Alternatively, the covering member 40H can be formed such that a flexible sheet in which the lateral surface covering portions 40H2 and the flange portions 40H3 extending from the central covering portion 40H1 are located in the same plane is bonded to the upper surface 20a of the electronic component 20, and then Step S13 of processing the covering member (see FIG. 6) is performed, in which the lateral surface covering portions 40H2 and the flange portions 40H3 are processed to be disposed along the lateral surfaces 20b of the electronic component 20 and the substrate 5.

In the first to seventh modifications, the covering member 40 contains the coloring agent described above to be white or to have a color similar to a color of the phosphor contained in the light-transmissive member 2 of the light-emitting device 10.

As described above, in the first to seventh modifications of the covering member 40 of the light-emitting module 100, with the covering member 40 covering the upper surface 20a of the electronic component 20 or the area from the upper surface 20a to the lateral surfaces 20b of the electronic component 20, the black color of the electronic component 20 can be more effectively concealed so that the black color of the electronic component 20 is not recognized through the lens 30 even when seen in a view other than a front view.

Figure 6:
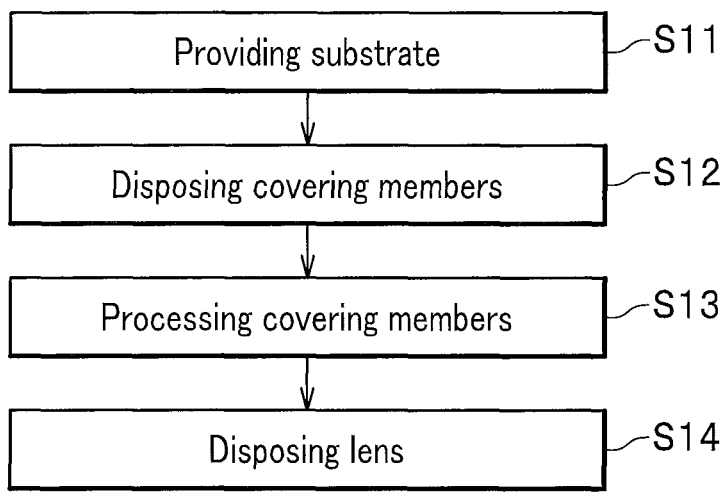
FIG. 6 is a flowchart of another method of manufacturing the light-emitting module.

Also, the light-emitting module 100 can be manufactured by performing Step S11 of providing substrate and Step S12 of disposing covering members described above, Step S13 of processing the covering member, and Step S14 of disposing a lens in this order as shown in FIG. 6.

Second Embodiment

Next, a light-emitting module 100B according to a second embodiment will be described.

Figure 7:
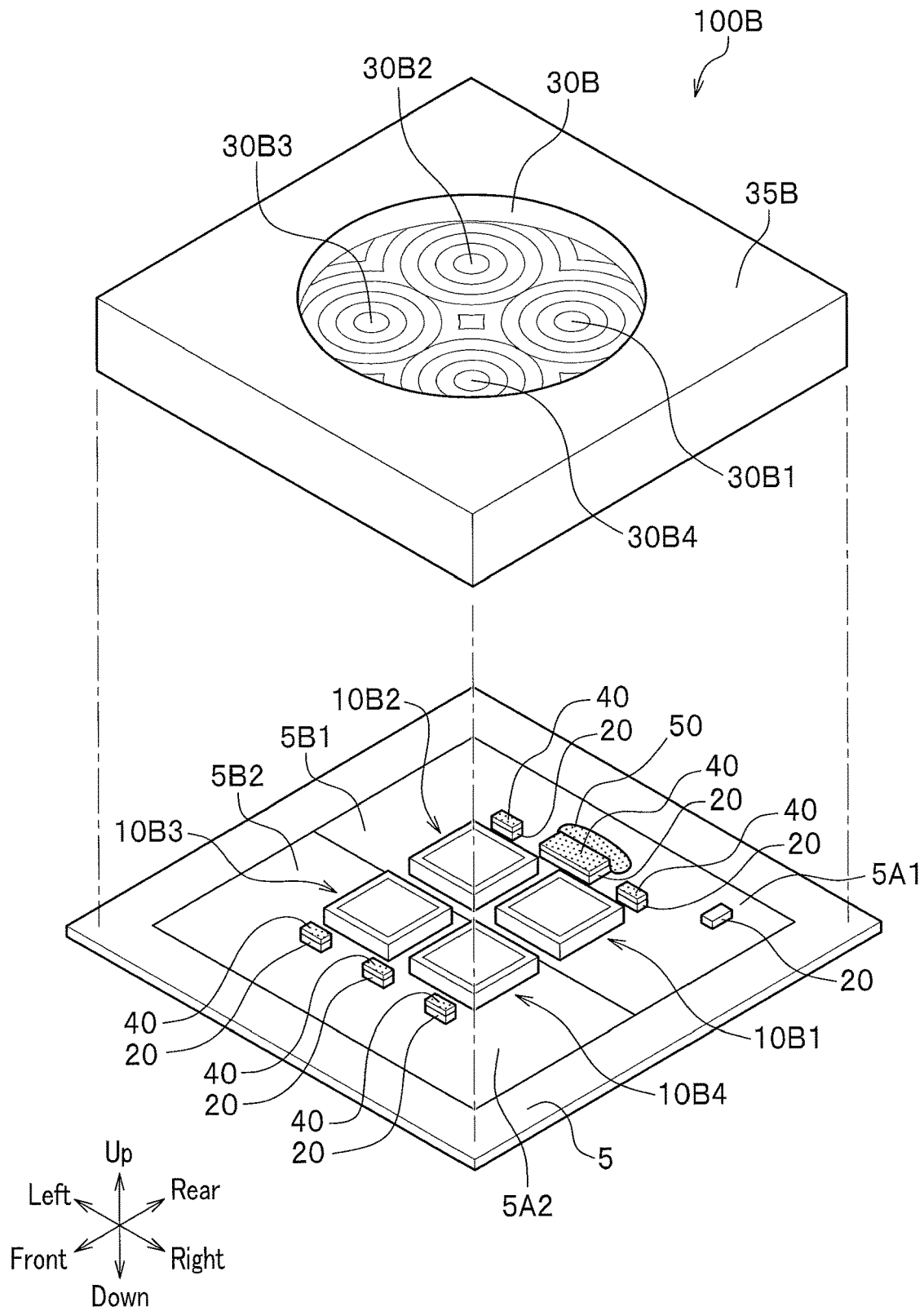
FIG. 7 is a schematic exploded perspective view of a structure of a light-emitting module according to a second embodiment.
Figure 8:
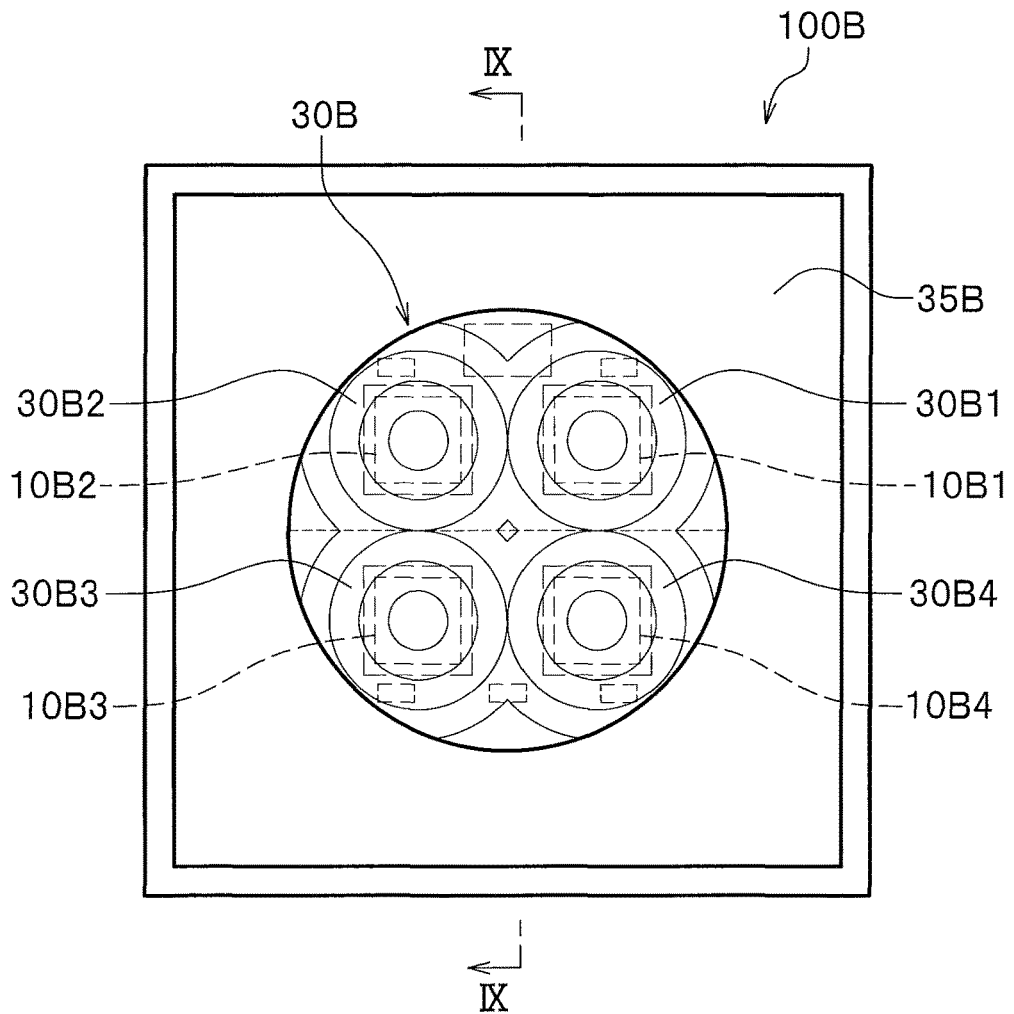
FIG. 8 is a schematic plan view of the light-emitting module according to the second embodiment.
Figure 9:
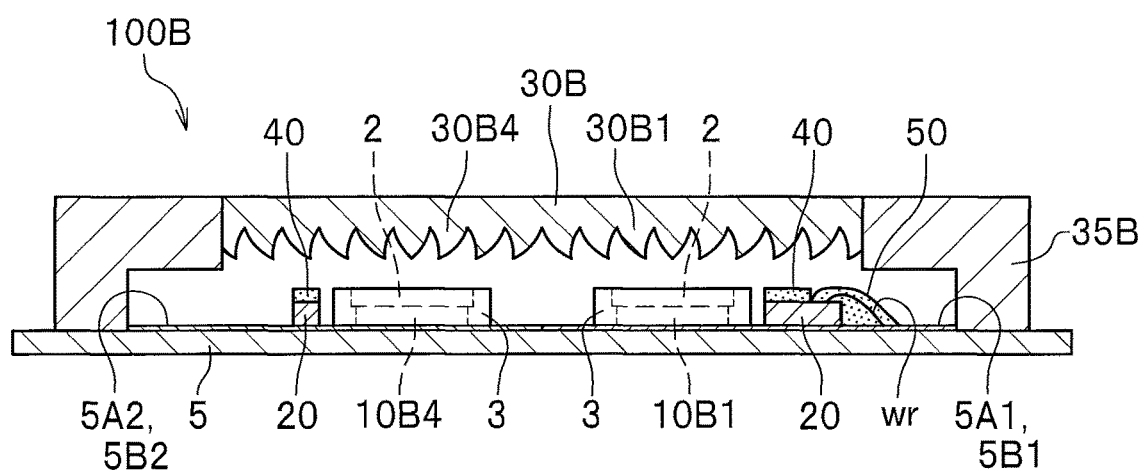
FIG. 9 is a schematic cross-sectional view of the internal structure of the light-emitting module taken along the line IX-IX of FIG. 8.

FIG. 7 is a schematic exploded perspective view of the structure of the light-emitting module according to the second embodiment. FIG. 8 is a schematic plan view of the light-emitting module according to the second embodiment. FIG. 9 is a schematic cross-sectional view of the internal structure of the light-emitting module according to the second embodiment.

The light-emitting module 100B according to the second embodiment differs from the light-emitting module 100 according to the first embodiment in the number of the light-emitting elements and in that the lens is a fly's eye lens. In the description below, structures that are the same as those in the light-emitting module 100 shown in FIG. 1 are indicated by the same reference numerals, and their repetitive descriptions can be omitted.

The light-emitting module 100B includes first to fourth light-emitting devices 10B1 to 10B4 arrayed on the substrate 5 and includes a fly's eye lens 30B. Each of the first to fourth light-emitting devices 10B1 to 10B4 is a light-emitting device including the light-emitting element 1 and the light-transmissive member 2 containing a phosphor. The fly's eye lens 30B is disposed above the substrate 5 via a lens frame 35B and includes a plurality of (for example, four in the drawings) lens portions 30B1 to 30B4 each of which faces a respective one of the light-emitting elements 1. In a plan view, each of the four light-emitting elements 1 faces a respective one of the lens portions 30B1 to 30B4. Each of the first light-emitting device 10B1 and the second light-emitting device 10B2 includes the light-emitting element 1 and the light-transmissive member 2 containing a phosphor such that the light-emitting devices emit light having similar colors. Each of the third light-emitting device 10B3 and the fourth light-emitting device 10B4 includes the light-emitting element 1 and the light-transmissive member 2 containing a phosphor such that the light-emitting devices emit light having different colors from those of the first light-emitting device 10B1 and the second light-emitting device 10B2. The first light-emitting device 10B1 and the second light-emitting device 10B2 are arrayed in parallel on the substrate 5 so as to face the third light-emitting device 10B3 and the fourth light-emitting device 10B4, respectively. As shown in FIG. 8, each of the light-emitting elements 1 is disposed such that the center of each of the light-emitting elements 1 is located at the center of a corresponding lens of the lens portions 30B1 to 30B4 of the fly's eye lens 30B in a plan view.

Each of the first to fourth light-emitting devices 10B1 to 10B4 includes the light-emitting element 1 and the light-transmissive member 2 containing a phosphor and/or a light-diffusing material. The emission wavelengths of the light-emitting elements 1 and the phosphors contained in the light-transmissive members of the first to fourth light-emitting devices 10B1 to 10B4 are selected such that the first light-emitting device 10B1 and the second light-emitting device 10B2 emit white light and such that the third light-emitting device 10B3 and the fourth light-emitting device 10B4 emit amber light.

The first light-emitting device 10B1 and the second light-emitting device 10B2 have the same structure as described above, and each of the first light-emitting device 10B1 and the second light-emitting device 10B2 includes the light-emitting element 1, the light-transmissive member 2 containing a phosphor, and the protective member 3. The third light-emitting device 10B3 and the fourth light-emitting device 10B4 have substantially the same structure as the first light-emitting device 10B1 and the second light-emitting device 10B2 except for the light-emitting element and/or the type of the phosphor contained.

The term "amber" as used herein refers to a chromaticity range including the longer-wavelength range of yellow and the shorter-wavelength range of yellowish red in JIS Z 8110, and a chromaticity range between the yellow range and the short-wavelength range of yellow red in JIS Z 9101, which defines safety colors. For example, the "amber" as used herein refers to a color having a dominant wavelength in a range of 580 nm to 600 nm.

For a red phosphor contained in the light-transmissive members 2 of the third light-emitting device 10B3 and the fourth light-emitting device 10B4, for example, a nitride phosphor can be preferably used. Examples of the nitride phosphor include SiAlON-based phosphor, $(Sr_{0.97}Eu_{0.3})_2Si_5N_8$, $(Ca_{0.985}Eu_{0.015})_2Si_5N_8$, and $(Sr_{0.679}Ca_{0.291}Eu_{0.03})_2Si_5N_8$.

The resin materials, glass, and the like described above can be used for base materials of the light-transmissive members 2 containing the red phosphor.

Known phosphors other than the yellow phosphors and red phosphors described above can be used for the phosphor contained in the light-transmissive members. Using these phosphors in combination allows for obtaining the light-emitting device configured to emit light having a desired color.

The substrate 5 includes a first region 5B1 in which the first light-emitting device 10B1 and the second light-emitting device 10B2 are disposed and a second region 5B2 in which the third light-emitting device 10B3 and the fourth light-emitting device 10B4 are disposed.

In the first region 5B1, a yellow resist layer 5A1 having a color similar to a color of the light-transmissive members 2, containing a phosphor, of the first light-emitting device 10B1 and the second light-emitting device 10B2 is disposed on the surface of the base. In the second region 5B2, an amber resist layer 5A2 having a color similar to a color of the light-transmissive members 2, containing a phosphor, of the third light-emitting device 10B3 and the fourth light-emitting device 10B4 is disposed on the surface of the base.

The resist layers in the first region 5B1 and the second region 5B2 function also as a protective film for the wiring to be formed. The resist layers can contain a reflective material, which allows for increasing the light extraction efficiency of the light-emitting module 100B.

The lens portions 30B1 to 30B4 of the fly's eye lens 30B in this example are Fresnel lenses. Each of the Fresnel lenses has a surface having irregularities and a flat surface opposite to the surface having irregularities, and is disposed such that the surface having irregularities faces a corresponding one of the first to fourth light-emitting devices 10B1 to 10B4 so as to allow light emitted from the first to fourth light-emitting devices 10B1 to 10B4 to be incident on the surface having irregularities and to be emitted from the flat surface. The fly's eye lens 30B is provided with the lens frame 35B on an outer periphery of the fly's eye lens 30B. The lens frame 35B is spaced apart from the fly's eye lens 30B such that an air layer is present between the light incident surface of the fly's eye lens 30B and the upper surfaces of the first to fourth light-emitting devices 10B1 to 10B4 and.

The covering members 40 (40B to 40H) have the same structures and materials as described above as shown in FIG. 4A to FIG. 4H.

The covering members 40 (40B to 40H) can have a various thickness according to the types and heights of the electronic components 20 from the substrate 5 such that the covering members 40 (40B to 40H) are not in contact with the lens 30. The covering members 40 (40B to 40H) can have a uniform thickness according to the heights of the electronic components 20 from the substrate 5 to the extent that the covering members 40 (40B to 40H) are not in contact with the lens 30.

The covering members 40 disposed on the electronic components 20 near the first light-emitting device 10B1 and the second light-emitting device 10B2 contain a coloring agent having a color similar to a color of the light-transmissive members 2 containing a yellow phosphor. The covering members 40 disposed on the electronic components 20 near the third light-emitting device 10B3 and the fourth light-emitting device 10B4 contain a coloring agent having an amber color similar to a color of the light-transmissive members 2 containing a yellow phosphor and a red phosphor.

In the light-emitting module 100B, the first light-emitting device 10B1 and the second light-emitting device 10B2 can be controlled separately from the third light-emitting device 10B3 and the fourth light-emitting device 10B4. With such a configuration, when the light-emitting module 100B is used for a camera flash module, the emission color can be adjusted to a desired color according to the subject. For example, amber light is emitted when only the third light-emitting device 10B3 and the fourth light-emitting device 10B4 are turned on, and white light is emitted when only the first light-emitting device 10B1 and the second light-emitting device 10B2 are turned on. When all of the first to fourth light-emitting devices 10B1 to 10B4 are turned on at the same time, both white light and amber light are emitted, and are diffused by the fly's eye lens 30B.

The light-emitting module 100B can be manufactured using a method substantially the same as the method of manufacturing the light-emitting module 100 described above except for the number of the light-emitting devices, through steps same as those in FIG. 5 and FIG. 6.

Further, the number of the light-emitting devices 10 can be four as described above or can be two, three, or five. The number of the lens portions of the fly's eye lens is increased according to the number of the light-emitting devices. When using four light-emitting devices, the light-emitting devices can be alternately arrayed in the row and column directions such that the first light-emitting device 10B1 and the second light-emitting device 10B2 that are configured to emit white light are disposed in the first row of the first column and the second row of the second column, respectively, and such that the third light-emitting device 10B3 and the fourth light-emitting device 10B4 that are configured to emit amber light are disposed in the first row of the second column and the second row of the first column, respectively. Accordingly, with the covering members 40 having a color similar to a color of the surrounding members and covering the electronic components 20, with uneven illuminance distributions of the emission colors in the light-emitting module 100B can be prevented. The light-emitting module 100B can illuminate an irradiation area with light having a uniform color even when a mixed color of light obtained from the first to fourth light-emitting devices 10B1 to 10B4 is emitted.

It is to be understood that, although certain embodiments of the present invention have been described, various other embodiments and variants may occur to those skilled in the art that are within the scope and spirit of the invention, and such other embodiments and variants are intended to be covered by the following claims.

What is claimed is:

1. A light-emitting module comprising:
   a substrate;
   at least one light-emitting element disposed on the substrate;
   at least one electronic component disposed on the substrate;
   a lens disposed apart from the at least one light-emitting element and the at least one electronic component to face the at least one light-emitting element and the at least one electronic component; and
   at least one plate-shaped covering member each disposed between the lens and a corresponding one of the at least one electronic component, the at least one covering member containing a coloring agent,
   wherein the at least one light-emitting element comprises a plurality of light-emitting elements, and
   wherein the lens is a fly's eye lens comprising a plurality of lens portions corresponding to the number of the light-emitting elements.

2. The light-emitting module according to claim 1, wherein the at least one covering member is disposed apart from the lens.

3. The light-emitting module according to claim 2, wherein the at least one covering member has a color similar to a color of the light-emitting element or a color of the substrate.

4. The light-emitting module according to claim 2, wherein the lens is a Fresnel lens.

5. The light-emitting module according to claim 2, wherein the lens contains a light-diffusing material.

6. The light-emitting module according to claim 1, wherein each of the at least one covering member has a size substantially equal to or larger than a size of an upper surface of a corresponding one of the at least one electronic component in a plan view.

7. The light-emitting module according to claim 1, wherein each of the at least one covering member has a plate shape extending from an upper surface of a corresponding one of the at least one electronic component and covering at least one lateral surface of lateral surfaces of the corresponding one of the at least one electronic component.

8. The light-emitting module according to claim 1, wherein each of the at least one covering member is disposed at least on an upper surface of a corresponding one of the at least one electronic component.

9. The light-emitting module according to claim 1, wherein the at least one covering member has a color similar to a color of the light-emitting element or a color of the substrate.

10. The light-emitting module according to claim 1, wherein the lens is a Fresnel lens.

11. The light-emitting module according to claim 1, wherein the lens contains a light-diffusing material.

12. The light-emitting module according to claim 1, wherein each of the at least one covering member is bonded to a corresponding one of the at least one electronic component by a resin adhesive or by welding.

13. The light-emitting module according to claim 1,
wherein each of the at least one light-emitting element is provided with a light-transmissive member on a light extraction surface of the light-emitting element,
wherein the light-transmissive member contain a phosphor and/or a diffusing material, and
wherein the light-transmissive member has a color similar to a color of the covering member.

14. The light-emitting module according to claim 1,
wherein an upper surface of at least one of the at least one electronic component has a first portion and a second portion,
wherein the first portion is covered with a corresponding at least one of the at least one covering member, and
wherein the second portion is covered with a covering resin.

* * * * *